United States Patent
Huang et al.

(10) Patent No.: US 6,450,827 B1
(45) Date of Patent: Sep. 17, 2002

(54) SOCKET HAVING MATING INDICATOR

(75) Inventors: Yao-Chi Huang, Tu-Chen (TW); Ren-Chih Li, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/066,136

(22) Filed: Jan. 30, 2002

Related U.S. Application Data

(63) Continuation-in-part of application No. 09/993,081, filed on Nov. 13, 2001.

(30) Foreign Application Priority Data

Dec. 26, 2001 (TW) .......................................... 90223008

(51) Int. Cl.⁷ .......................................... H01R 13/625
(52) U.S. Cl. ...................................... 439/342; 439/259
(58) Field of Search ................................ 439/259–270, 439/342, 488, 489

(56) References Cited

U.S. PATENT DOCUMENTS

| | | | |
|---|---|---|---|
| 6,071,140 A | * 6/2000 | McHugh et al. | 439/342 |
| 6,200,154 B1 | * 3/2001 | Yu | 439/342 |
| 6,231,366 B1 | * 5/2001 | Pei et al. | 439/342 |
| 6,338,646 B1 | * 1/2002 | Hara et al. | 439/488 |

\* cited by examiner

*Primary Examiner*—Brian Sircus
*Assistant Examiner*—Son V. Nguyen
(74) *Attorney, Agent, or Firm*—Wei Te Chung

(57) ABSTRACT

A socket (1) includes a base (10), a cover (20) slidably attached to the base, an actuator (30) and an indicator (40). A receiving hole (14) is defined in the base. The cover defines a seat (25) comprising first and second stop walls (253, 254). A through hole (251) is defined in the seat. The actuator includes a head (31), an actuating portion (33) extending form the head and a eccentric pin (35) extending from the actuating portion. The actuating portion is rotatably received in the through hole of the cover. The eccentric pin is rotatably received in the receiving hole of the base. The indicator is attached to the actuator and received in the seat of the cover. When the cover is located at a first position relative to the base, the indicator abuts against the first stop wall of cover. When the cover is located at a second position relative to the base, the indicator abuts against the second stop wall of the cover.

7 Claims, 7 Drawing Sheets

SOCKET HAVING MATING INDICATOR

This is a continuation-in-part application of the copending application Ser. No. 09/993,081 filed 11/13/01.

BACKGROUND OF THE INVENTION

1. Field of the Invention

The present invention relates to a socket for connecting a central processing unit (CPU) with a printed circuit board (PCB) with zero insertion force (ZIF), and particularly to a socket having a mating indicator.

2. Prior Art

As shown in FIG. 1, a conventional ZIF socket is disclosed in China Patent No. ZL 99226536.3. The socket includes a base 5, a cover 6, a plurality of terminals, an actuator 7 and a mating indicator 8. The base 5 defines a receiving hole 52 and a retaining cavity 54 in communication with the receiving hole 52. The cover 6 is slidably attached to the base 5 and defines a through hole 62 corresponding to the receiving hole 52. The actuator 7 includes an actuating portion 71 ratably received in the receiving hole 52 and a eccentric pin 72 extending from the actuating portion 71 and rotatably receiving in the through hole 62. The actuating portion 71 includes first and second recesses 710, 712 at a peripheral surface thereof. The mating indicator 8 is secured in the retaining cavity 54 of the base 5 and has a resilient bent portion 82. When the cover 6 is located at a first position relative to the base 5, the resilient bent portion 82 mates with the first recess 710 of the actuating portion 71. When the cover 6 is located at a second position relative to the base 5, the resilient bent portion 82 mates with the second recess 712 of the actuating portion 71. Therefore, when the eccentric pin 72 of the actuator 7 is actuated to rotate the actuating portion 71 to locate the cover 6 at the first or second position, the bent portion 82 departs from the second or first recess 712 or 710 and then engages with the first or second recess 710 or 712 thereby indicating the position of the cover 6 and controlling actuation to the eccentric pin 72.

However, indication of engagement of the bent portion 82 of the indicator 8 and the recess 710 or 712 of the actuating portion 71 is not readily discernible. Thus, position of the cover 6 relative to the base 5 is uneasy to be controlled and this adversely affects assembling of a CPU to a PCB through the socket.

SUMMARY OF THE INVENTION

Accordingly, an object of the present invention is to provide a socket having a base, a cover and a mating indicator for obviously indicating relationship between the base and the cover.

Another object of the present invention is to provide a socket having an actuator and a mating indicator which prevents the actuator from excessive movement.

To achieve the above-mentioned object, an electrical connector in accordance with the present invention includes a base, a cover slidably attached to the base, an actuator and an indicator. A receiving hole is defined in the base. The cover defines a seat comprising first and second stop walls. A through hole is defined in the seat. The actuator includes a head, an actuating portion extending form the head and an eccentric pin extending from the actuating portion. The actuating portion is rotatably received in the through hole of the cover. The eccentric pin is rotatably received in the receiving hole of the base. The indicator is attached to the actuator and received in the seat of the cover. When the cover is located at a first position relative to the base, the indicator abuts against the first stop wall of cover. When the cover is located at a second position relative to the base, the indicator abuts against the second stop wall of the cover.

Other objects, advantages and novel features of the present invention will be drawn from the following detailed description of a preferred embodiment of the present invention with attached drawings, in which:

DETAILED DESCRIPTION OF THE PREFERRED EMBODIMENT

Figure 1:
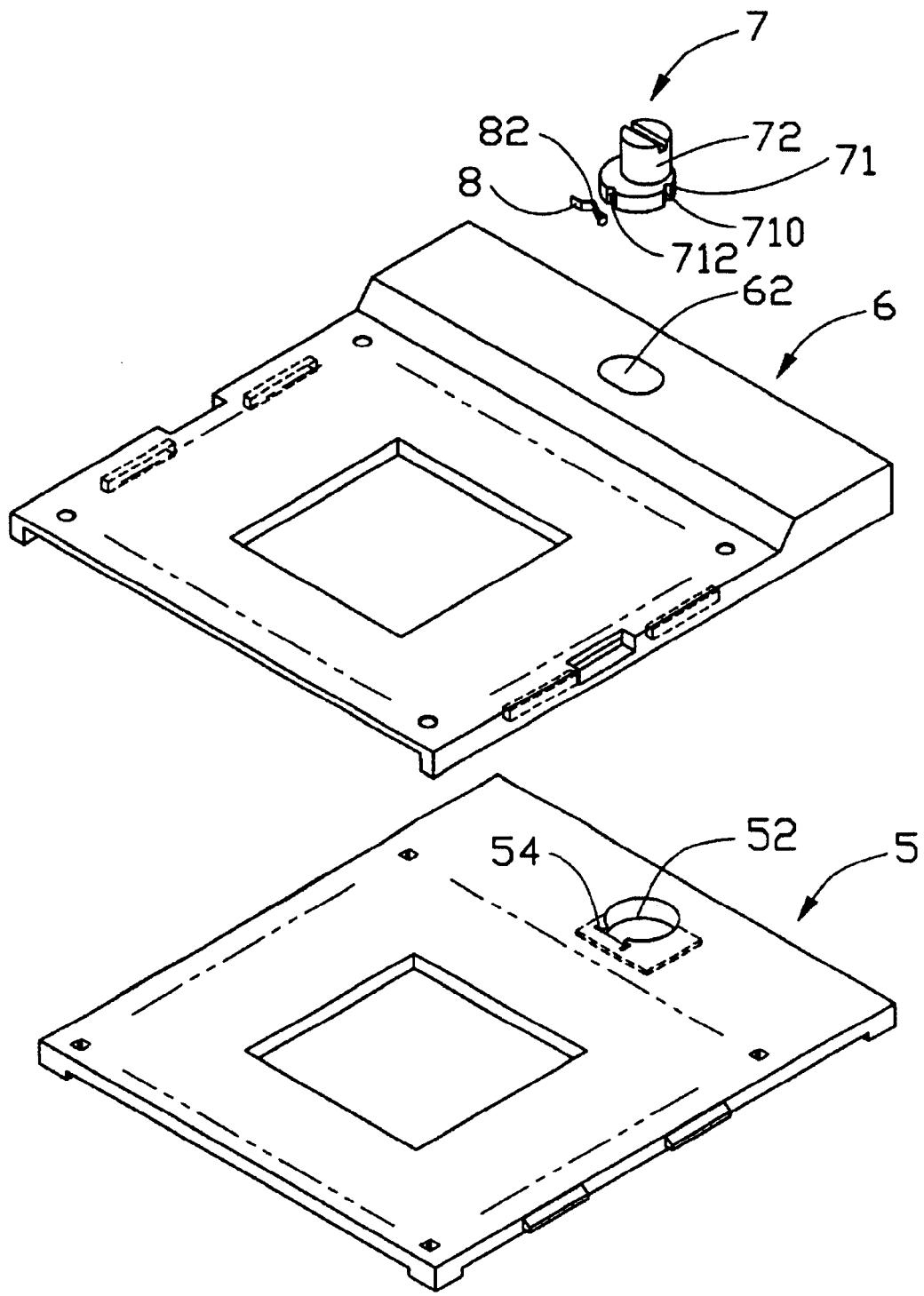
FIG. 1 is an exploded view of a conventional socket.
Figure 2:
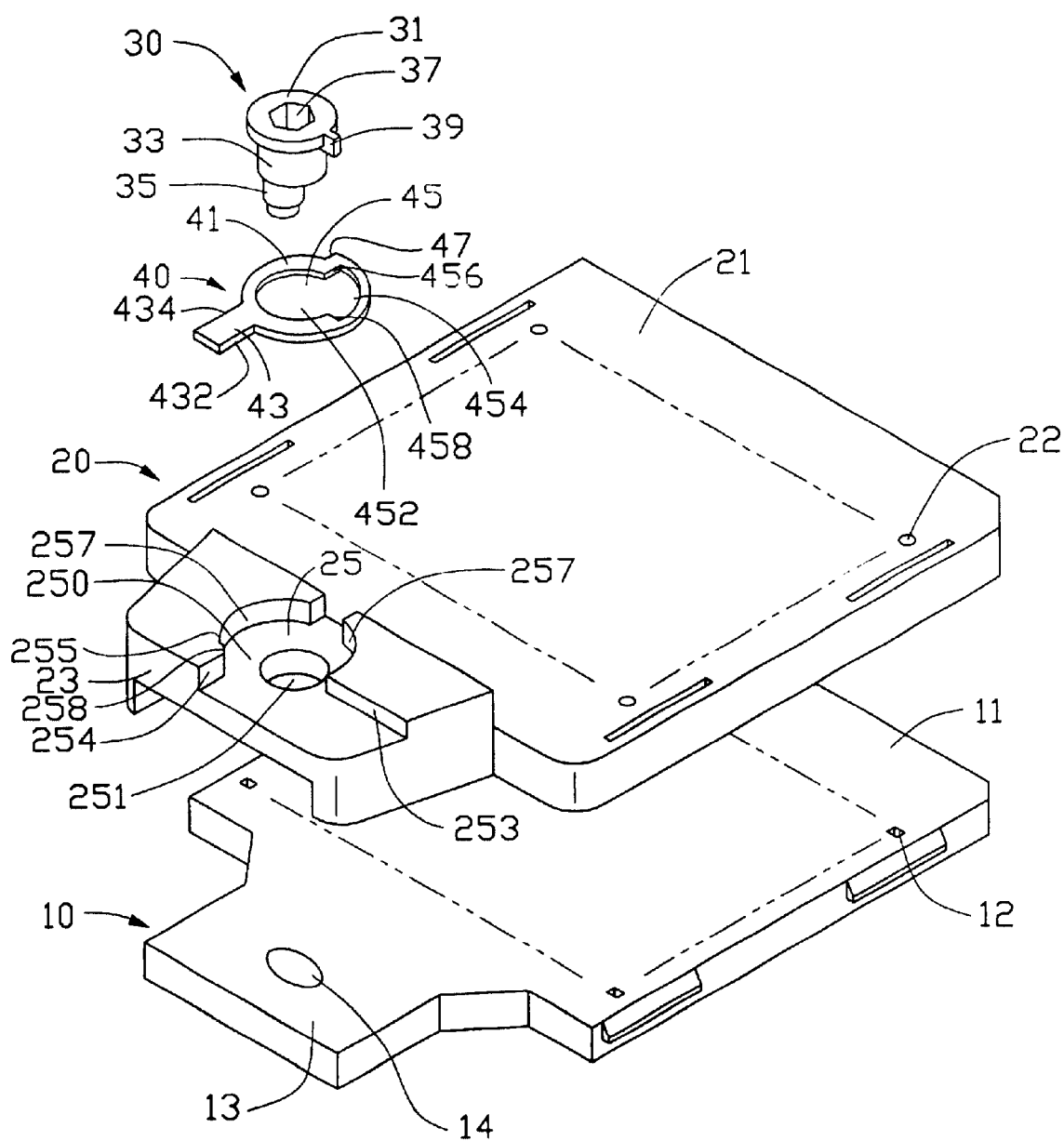
FIG. 2 is an exploded view of a socket in accordance with the present invention.

Referring to FIG. 2, a socket 1 in accordance with the present invention includes a base 10, a cover 20, an actuator 30 and an indicator 40. The base 10 includes a rectangular receptacle section 11 defining a plurality of cavities 12 therein, and a support section 13 extending from the receptacle section 11 and defining a receiving hole 14 therein.

The cover 20 slidably attached to the base 10 includes a rectangular insertion portion 21 defining a plurality of passages 22 therein, and a fixing portion 23 extending from the insertion portion 21 and defining a seat 25 therein. The seat 25 includes a recessed face 250, a through hole 251 extending from the recessed face 250 and first, second and third stop walls 253, 254, 255 extending upwardly from the recessed face 250. Two circular sidewalls 257 extend upwardly from the recessed face 250 and respectively connect with the first and third stop walls 253, 255. An arcuate wall 258 extends upwardly from the recessed face 250 and connects between the second and third stop walls 254, 255.

The actuator 30 includes a head 31, an actuating/rotation portion 33 extending from the head 31 and an eccentric/moving pin 35 extending from the actuating portion 33 opposite the head 31. A hexagonal recess 37 is defined in the head 31 for extension of a tool to drive the actuator 30. A block 39 extends from a peripheral surface of the head 31 and connects with the actuating portion 33.

Figure 3:
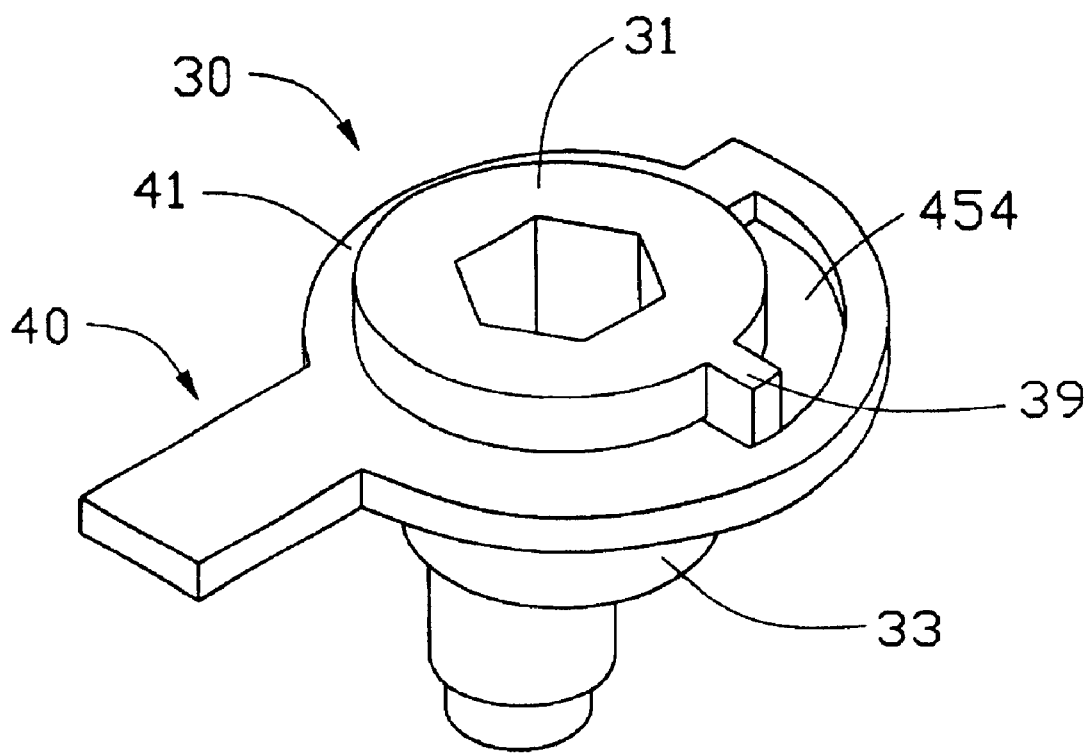
FIG. 3 is an assembled view of an actuator and an indicator of FIG. 2.

The indicator 40 includes a body 41 and a level 43 extending from the body 41. The body 41 defines a through opening 45 including a round portion 452 and an annular portion 454 in communication with the round portion 452. The annular portion 454 is defined between opposite first and second end walls 456, 458. The lever 43 includes a first stop surface 432 and an opposite second stop surface 434. The body 41 forms a third stop surface 47. As shown in FIG. 3, the indicator 40 is rotatably attached to the actuator 30. The actuating portion 33 extends through the round portion 452 of the through opening 45 with the block 39 movably received in the annular portion 454 of the through opening 45. The body 41 supports the head 31 of the actuator 30.

Figure 4:
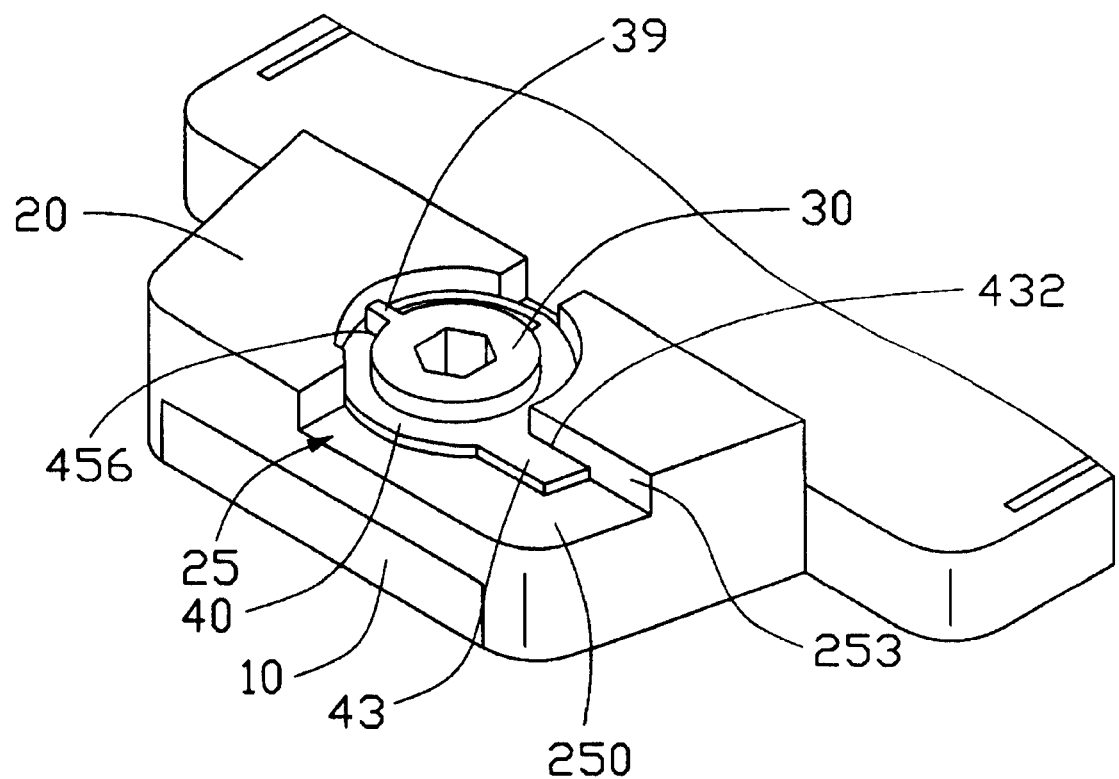
FIG. 4 is a cutaway assembled view of FIG. 2 showing the indicator locates at a first position.

Referring to FIGS. 2–4, in assembly, the cover 20 is slidably attached to the base 10. The actuating portion 33 of the actuator 30 extends through the round portion 452 of the through opening 45 of the indicator 40 and is rotatably received in the through hole 251 of the cover 20. The eccentric pin 35 of the actuator 30 is rotatably received in the receiving hole 14 of the base 10. The indicator 40 is rotatably received in the seat 25 of the cover 20 and abuts against the recessed face 250 of the seat 25.

Figure 5:
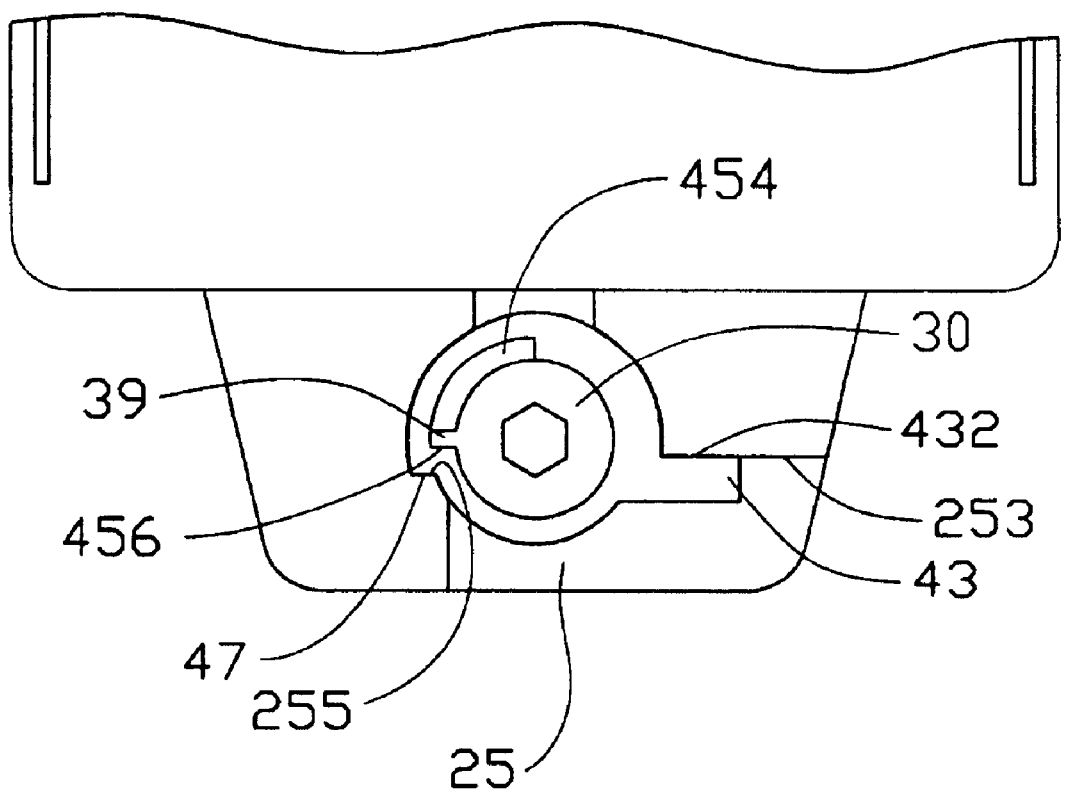
FIG. 5 is a top plane view of FIG. 4.

Referring to FIGS. 4 and 5, when the cover 20 is located at a first position relative to the base 10, the lever 43 of the indicator 40 is located at a first position with the first stop surface 432 thereof abutting against the first stop wall 253 of the cover 20. The third stop surface 47 abuts against the third stop wall 255 of the seat 25. The block 39 of the actuator 30 abuts against the first end wall 456 of the indicator 40.

Figure 6:
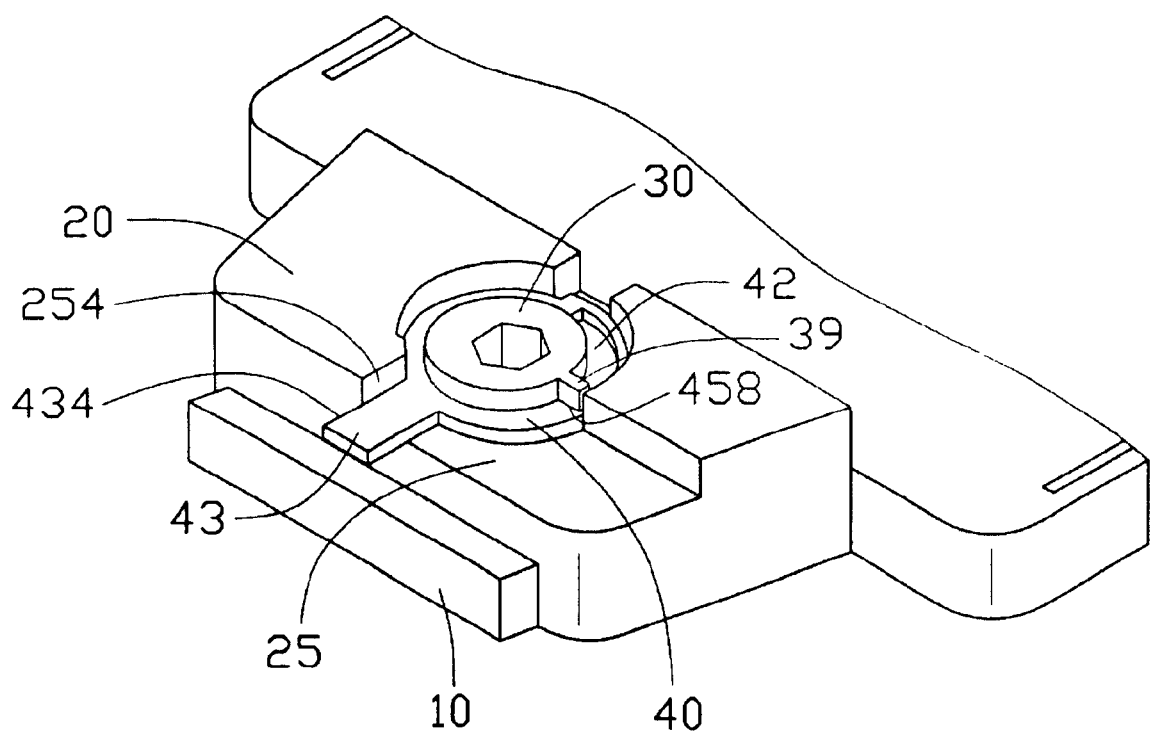
FIG. 6 is similar to FIG. 4, but showing the indicator locates at a second position.
Figure 7:
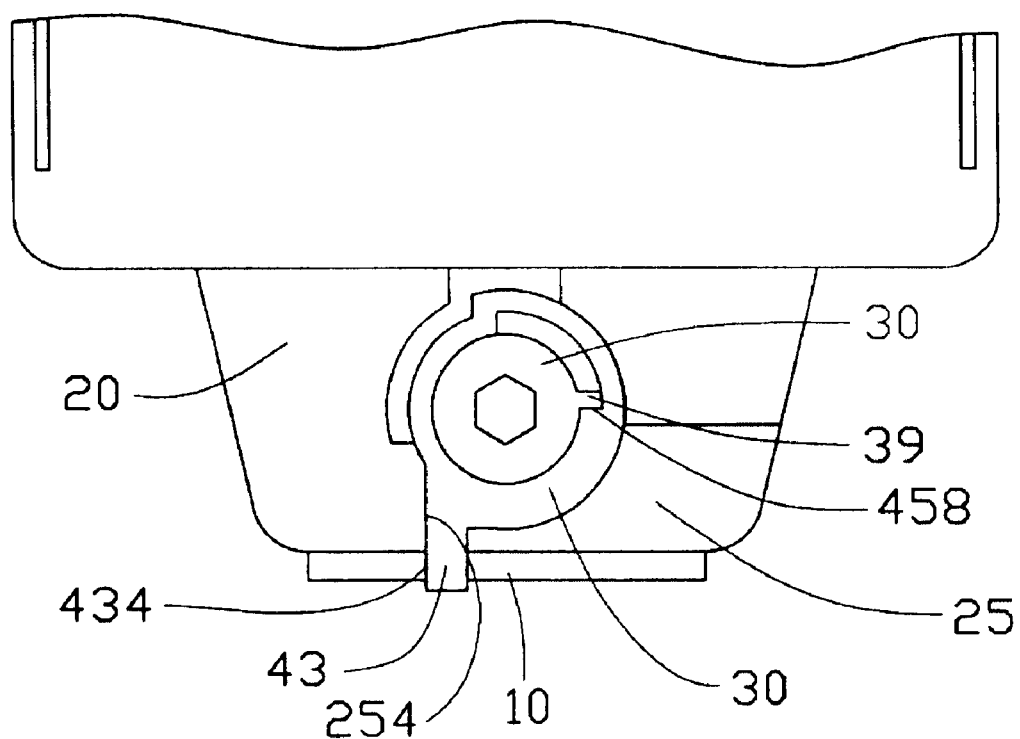
FIG. 7 is a top plane view of FIG. 6.

Referring to FIGS. 6 and 7, when the cover 20 is located at a second position relative to the base 10, the lever 43 of the indicator 40 is located at a second position with the second stop surface 434 thereof abutting against the second stop wall 254 of the seat 25. The block 39 of the actuator 30 abuts against the second end wall 458 of the indicator 40.

Referring to FIGS. 4–7, when the cover 20 is located at the first position, pins of a central processing unit (CPU, not shown) is extended into the passages 22 of the cover 20. The actuator 30 is driven via the hexagonal recess 37 thereof to rotate the actuating portion 33 thereof to move the cover 20 to the second position for mating with terminals (not shown) in the cavities 12 of the base 10. The block 39 of the actuator 30 is rotated in the annular portion 454 of the through hole 45 of the indicator 40 and then push the second end wall 458 of the indicator 40 to rotate. When the lever 43 of the indicator 40 is stopped by the second stop wall 254 of the seat 25 in the cover 20, the drive of the actuator 30 is obviously indicated to be stopped.

When the cover 20 is located at the second position, the pins of the CPU mate with the terminals of the base 10. To release the CPU from the socket 1, the actuator 30 is driven via the hexagonal recess 37 thereof to rotate the actuating portion 33 thereof to move the cover 20 to the first position. The block 39 of the actuator 30 is rotated in the annular portion 454 of the through hole 45 of the indicator 40 and then push the first end wall 456 of the indicator 40 to rotate. When the indicator 40 is stopped by the first and third stop walls 253, 255 of the seat 25 in the cover 20, the drive of the actuator 30 is obviously indicated to be stopped.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A socket for use with an Integrated Circuit (IC) package, comprising:
   a base;
   a cover slidably attached to the base, the cover defining a seat comprising first and second stop walls, a through hole being defined in the seat, the cover being slidable between a first position and a second position relative to the base;
   an actuator comprising a head, an actuating portion extending from the head and an eccentric pin extending downwardly from the actuating portion, the actuating portion being rotatably received in the through hole of the cover, the eccentric pin being rotatably received in the base; and
   an indicator attached to the actuator and received in the seat of the cover, wherein when the cover is located at the first position, the indicator has a lever abutting against the first stop wall of cover, and when the cover is located at the second position, the lever abuts against the second stop wall of the cover; wherein
   the indicator further comprises a body defining a through opening for extension of the actuating portion of the actuator, and said lever extends from the body for abutting against the first and second stop walls of the cover with first and second stop surfaces of the lever, respectively; wherein
   a third stop wall is formed at the seat of the cover, and wherein a third stop surface is formed at the body of the indicator and abuts against the third stop wall of the cover when the cover is located at the first position.

2. The socket as claimed in claim 1, wherein the base defines a receiving hole receiving the eccentric pin of the actuator therein.

3. The socket as claimed in claim 1, wherein a block extends from the head of the actuator and connects with the actuating portion, and the through opening of the indicator comprises a round portion for extension of the actuating portion of the actuator and an annular cutout portion in communication with the round portion and receiving the block of the actuator.

4. The socket as claimed in claim 1, wherein a hexagonal recess is defined in the head of the actuator.

5. A socket for use with an Integrated Circuit (IC) package, comprising:
   a base defining a first hole;
   a cover attached to the base and moveable relative to the base along a front-to-back direction, said cover defining a second hole,
   an actuator comprising a head with a rotation portion and a moving pin integrally formed thereunder, said rotation portion receivably engaged with one of said first hole and said second hole, said moving pin guidably and receivably engaged with the other of said first hole and said second hole, so that when said head is rotated, said cover is moveable relative to said base along said front-to-back direction;
   an indicator coaxially rotatably disposed with regard to the actuator and being actuated to rotate by rotation of said actuator; wherein
   a block is formed on said actuator, and said block is moveably received within a fan like annular groove formed in said indicator; wherein
   said indicator defines two opposite stop walls at two ends of said annular groove to restrain rotation of said actuator relative to said indicator, wherein
   said annular groove is not radially exposed to an exterior; wherein
   said annular groove extends through said block of said indicator in a vertical direction.

6. The socket as claimed in claim 5, wherein in an operation said actuator rotates within a range of about 180 degrees while said indicator rotates within a range of about 90 degrees.

7. The socket as claimed in claim 5, wherein a rotation portion is snugly received in said second hole while said moving pin is slidably received in said first hole.

* * * * *